United States Patent
Jun et al.

(10) Patent No.: US 6,603,687 B2
(45) Date of Patent: Aug. 5, 2003

(54) SEMICONDUCTOR DEVICES, CIRCUITS AND METHODS FOR SYNCHRONIZING THE INPUTTING AND OUTPUTTING DATA BY INTERNAL CLOCK SIGNALS DERIVED FROM SINGLE FEEDBACK LOOP

(75) Inventors: Young-Hyun Jun, Seoul (KR); Chul-Soo Kim, Kyunggi-do (KR); Ho-Young Song, Kyunggi-do (KR)

(73) Assignee: Samsung Electronics Co., Suwon (KR)

( * ) Notice: Subject to any disclaimer, the term of this patent is extended or adjusted under 35 U.S.C. 154(b) by 0 days.

(21) Appl. No.: 10/074,592

(22) Filed: Feb. 11, 2002

(65) Prior Publication Data

US 2003/0128597 A1 Jul. 10, 2003

(30) Foreign Application Priority Data

Jan. 9, 2002 (KR) .......................................... 2002-1251

(51) Int. Cl.⁷ ................................................. G11C 7/00
(52) U.S. Cl. ....................................... 365/194; 365/233
(58) Field of Search ................................. 365/194, 233

(56) References Cited

U.S. PATENT DOCUMENTS

| | | | |
|---|---|---|---|
| 5,642,082 A | 6/1997 | Jefferson | 331/25 |
| 5,663,665 A | 9/1997 | Wang et al. | 327/3 |
| 5,717,729 A * | 2/1998 | Iknaian et al. | 375/356 |
| 5,771,264 A | 6/1998 | Lane | 375/376 |
| 6,150,856 A | 11/2000 | Morzano | 327/149 |
| 6,191,632 B1 * | 2/2001 | Iwata et al. | 327/295 |
| 6,194,930 B1 | 2/2001 | Matsuzaki et al. | 327/156 |
| 6,229,363 B1 | 5/2001 | Eto et al. | 327/158 |
| 6,313,674 B1 * | 11/2001 | Akita et al. | 327/155 |

* cited by examiner

*Primary Examiner*—M. Tran
(74) *Attorney, Agent, or Firm*—Marger Johnson & McCollom

(57) ABSTRACT

Devices, circuits and methods synchronize the inputting and outputting of groups of data into a memory cell array and out of a device. Synchronizing is performed by internal clock signals, both of which are derived from a single delay feedback loop.

53 Claims, 13 Drawing Sheets

SEMICONDUCTOR DEVICES, CIRCUITS AND METHODS FOR SYNCHRONIZING THE INPUTTING AND OUTPUTTING DATA BY INTERNAL CLOCK SIGNALS DERIVED FROM SINGLE FEEDBACK LOOP

CROSS REFERENCE TO RELATED APPLICATIONS

This application claims priority from Korean Priority Document No. P2002-01251, filed on Jan. 9, 2002 with the Korean Industrial Property Office, which document is hereby incorporated by reference.

BACKGROUND OF THE INVENTION

1. Field of the Invention

The present invention is related to the field of semiconductor memory devices, and more specifically to circuits for controlling clock delays or phases for inputting and outputting data into and out of such memory devices.

2. Description of the Related Art

Semiconductor devices, especially memory devices are used to store data. Data bits are stored by being input ("written") in one or more arrays of memory cells. Later they are output ("read out") from the memory cells.

Data is written into and read out of memory cell arrays in groups of synchronized bits. Some times the data of such a group is said to form a byte.

Synchronizing these operations is accomplished by using a clock signal throughout the device. An input clock signal CLK is provided, and often an internal clock IntCLK is additionally generated from the input clock signal CLK.

As memory devices are required to become faster, the clock signals become commensurately shorter. This allows less room for error in synchronizing inputting and outputting the data of a group.

To address this diminished room for error, present attempts are directed towards reducing the jitter of the internal clock IntCLK. The jitter arises from a number of factors, including variations in temperature, voltage, and method of manufacture of the device. Reducing the jitter reduces the margin of error, which reduces errors.

Reducing the jitter must take place both for data outputting operations (reading out), and also for data inputting operations (writing). The prior art provides two circuits in each memory device, one for writing data and one for reading data. Examples of these circuits are described below, using FIGS. 1–4.

Referring now to FIG. 1, a portion of a device 100 in the prior art is described, having a Memory Cell Array (MCA) 102 for storing data. Device 100 receives an input clock signal CLK.

Device 100 has a circuit 114 for locking a delay of a clock signal, so as to output groups of data from MCA 102 in a synchronized fashion. Circuit 114 is also known as a Delay Lock Loop (DLL) circuit.

Circuit 114 includes a variable delay circuit 122. Variable delay circuit 122 receives input clock signal CLK, and an adjustment signal ADJ1. Variable delay circuit 122 outputs a read signal PCLKR, which is a delayed version from input clock signal CLK. The delay is by a variable amount, which is controlled by adjustment signal ADJ1.

Circuit 114 also includes a phase detector 124. Phase detector 124 receives input clock signal CLK and a feedback clock signal FCLK1. It will be recognized from the below that feedback clock signal FCLK1 is generated from read signal PCLKR, after being subjected to some delays.

Phase detector 124 outputs the adjustment signal ADJ1. Adjustment signal ADJ1 is such that the inputs of phase detector 124 are maintained in phase. In other words, the adjustment signal ADJ1 is such that the phase of the feedback clock signal FCLK1 is maintained to coincide with the phase of the input clock signal CLK.

Read signal PCLKR is output into a Data Out (DOUT) clock tree 132 of device 100. From there it is used to synchronize a group of DOUT Buffers 134, as they receive output data DATA_OUT from Memory Cell Array (MCA) 102. The output data is then forwarded to a group of DOUT Drivers 136, and from there to a group of DOUT pads 138.

Device 100 usually has a plurality of DOUT Pads, one for each of the data bits of the group. Examples include X4, X8, X16, X32, X64. FIG. 1 shows the case of eight data bits (X8). Accordingly, group of DOUT Pads 138 includes individual DOUT pads 138-1, 138-2, . . . , 138-8. This additionally means that group of DOUT Buffers 134 is made from 8 individual buffers 134-1, 134-2, . . . , 134-8. Moreover, group of DOUT Drivers 136 is made from 8 individual buffers 136-1, 136-2, . . . , 136-8.

It will be appreciated that each of DOUT clock tree 132, group of DOUT Buffers 134, and group of DOUT Drivers 136 contributes a delay. These delays, along with their cumulative effect, may result in not synchronizing the outputting of data.

Returning to circuit 114, a feedback loop is further made, which starts from variable delay circuit 122 and ends in phase detector 124. The feedback loop receives internal clock signal PCLKR, and outputs feedback clock signal FCLK1.

The feedback loop is intended to replicate the delays along the path of DOUT clock tree 132, group of DOUT Buffers 134, and group of DOUT Drivers 136. Accordingly, in the embodiment of FIG. 1, three delay elements 142, 144, 146 are provided, which may be made as replicas. In particular, delay element 142 may be made as a Replica DOUT Clock Tree 142, delay element 144 may be made as a Replica DOUT Buffer 144, and delay element 146 may be made as a Replica DOUT Driver 146.

Referring now to FIG. 2, a timing diagram is shown to describe the operation of the circuit of FIG. 1. Internal clock signal PCLKR is delayed with respect to input clock signal CLK by time interval TD1, as imposed by variable delay 122. PCLKR is a preceding clock signal against the input clock signal CLK. The amount of preceding delay is the sum of delays TD2, TD3, TD4 of the delay elements 142, 144, 146 respectively. Output data DATA_OUT from MCA 102 is synchronized with a PCLKR2 signal, and transferred to group of DOUT Drivers 136 to output data DOUT, which is adjusted to a rising edge of the next cycle of input clock signal CLK.

Referring now to FIG. 3, another portion of device 100 is described. Some elements of device 100 are shown again, such as MCA 102 and input clock signal CLK.

Device 100 has a circuit 314 for locking a delay, so as to input groups of data into MCA 102 in a synchronized fashion. Circuit 314 is also known as a Delay Lock Loop (DLL) circuit.

Circuit 314 includes a variable delay circuit 322, which is similar to circuit 122. Variable delay circuit 322 receives input clock signal CLK, and an adjustment signal ADJ3.

Variable delay circuit 322 outputs a write signal PCLKW, which is a delayed version from clock signal CLK. The delay is by a variable amount, which is controlled by adjustment signal ADJ3.

Circuit 314 also includes a phase detector 324, which is similar to phase detector 124. Phase detector 324 receives clock signal CLK and a feedback clock signal FCLK3. It will be recognized from the below that feedback clock signal FCLK3 is generated from write signal PCLKW, after being subjected to some delays.

Phase detector 324 outputs the adjustment signal ADJ3. Adjustment signal ADJ3 is such that the inputs of phase detector 324 are maintained in phase. In other words, the adjustment signal ADJ3 is such that the phase of the feedback clock signal FCLK3 is maintained to coincide with the phase of the input clock signal CLK.

Write signal PCLKW is output into a Data In (DIN) clock tree 362 of device 100. DIN clock tree 362 may be made similarly to DOUT clock tree 132 of FIG. 1.

From DIN clock tree 362, write signal PCLKW is used to synchronize a group of DIN Latches 364, as they receive input data DIN from a group of DIN pads 368. The latched data is then input into MCA 102.

As per the above, FIG. 1 shows the case of X8 bits. This means that group of DIN latches 364 is made from 8 DIN Latches 364-1, 364-2, . . . , 364-8.

It will be appreciated that DIN clock tree 132 contributes a delay. Without correction, this delay may result in not synchronizing the inputting of data.

Returning to circuit 314, a feedback loop is further made, which starts from variable delay circuit 322 and ends in phase detector 324. The feedback loop receives write signal PCLKW, and outputs feedback clock signal FCLK3.

The feedback loop is intended to replicate a delay along the path of DIN clock tree 362. Accordingly, in the embodiment of FIG. 3, a delay element 372 is provided, which may be made as a replica. In particular, delay element 372 may be made as a Replica DIN Clock Tree 372.

Referring now to FIG. 4, a timing diagram is shown to describe the operation of the circuit of FIG. 3. The operation of circuit 314 is similar to that of circuit 114. Generally, however, these two circuits result in different amounts of phase delay being locked.

Internal clock signal PCLKW is delayed with respect to input clock signal CLK by time interval TD5, as imposed by variable delay 322. PCLKW is a preceding clock signal against the input clock signal CLK. The amount of preceding delay is delay TD6 of delay element 372. Input data DIN at group of DIN Latches 364 is synchronized by a PCLKW2 signal, for transferring to MCA 102 as DATA_IN, adjusted to a rising edge of the next cycle of input clock signal CLK.

The detailed operation of exemplary locking circuitry or DLLs is described in the following U.S. patents, the disclosures of which are incorporated by reference: U.S. Pat. Nos. 6,194,930, 6,313,674 B1 , 6,150,856, 6,229,363, 5,663,665, 5,771,264 and 5,642,082.

As devices are increasingly required to become smaller, it is increasingly required to economize on circuitry. By including two feedback loops with replica circuits, device 100 requires a large area.

BRIEF SUMMARY OF THE INVENTION

The present invention overcomes these problems and limitations of the prior art.

Generally, the present invention provides devices, circuits and methods for synchronizing the inputting and outputting of groups of data into a memory cell array and out of a device. Synchronizing is performed by internal clock signals, both of which are derived from a single delay feedback loop.

Since a single loop is used to derive the two internal clock signals, space is saved on the semiconductor memory device, and permits it to become smaller. It also requires less power consumption.

The invention will become more readily apparent from the following Detailed Description, which proceeds with reference to the drawings, in which:

DETAILED DESCRIPTION OF THE PREFERRED EMBODIMENT(S)

As has been mentioned, the present invention provides devices, circuits and methods for synchronizing the inputting and outputting of groups of data into a memory cell array and out of a device. Synchronizing is performed by internal clock signals, both of which are derived from a single delay feedback loop. The invention is now described in more detail.

Figure 1:
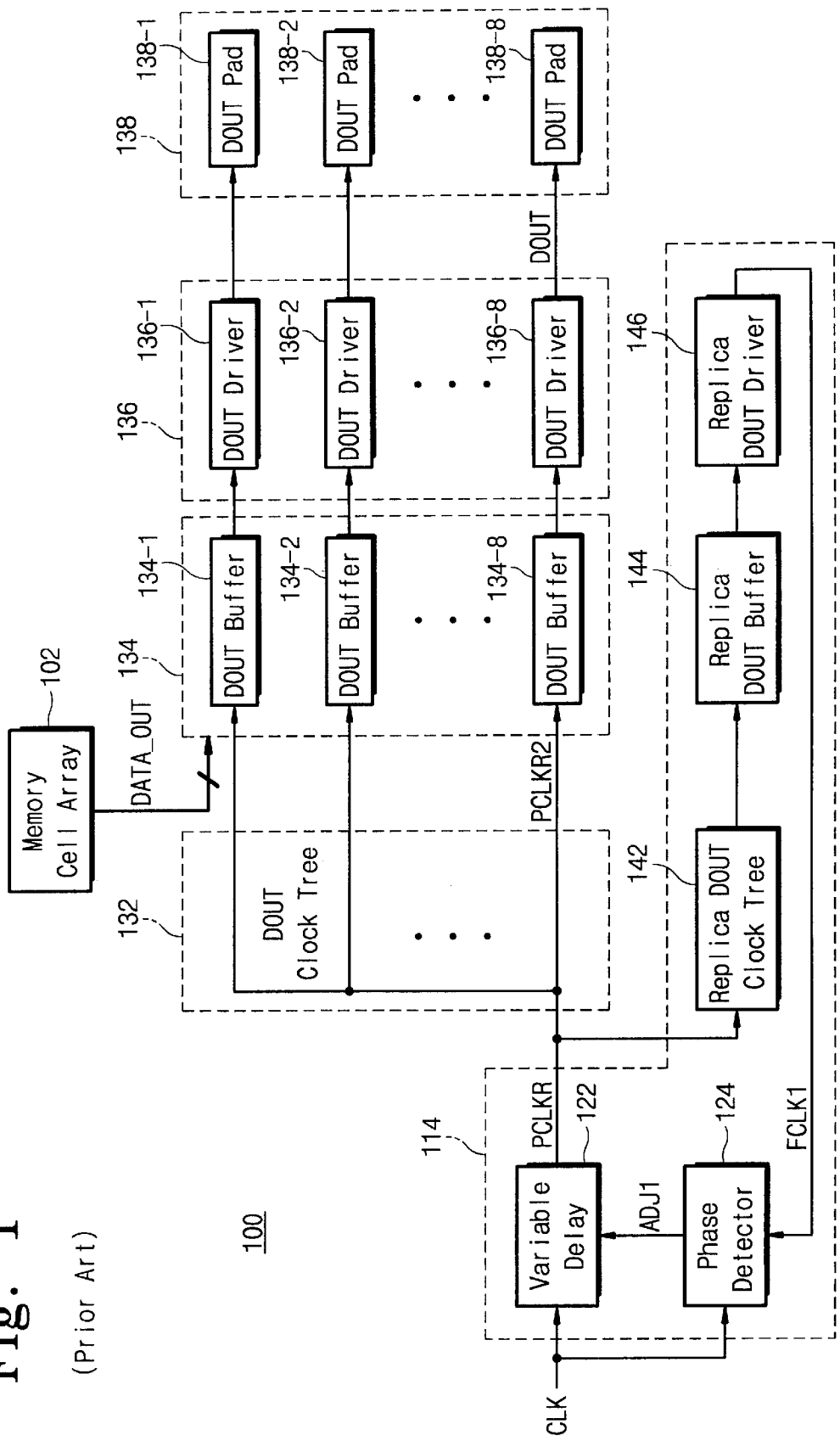
FIG. 1 is a block diagram of a portion of a prior art device, showing a circuit for reading out data from a memory cell array, and of a delay lock loop for controlling a delay of an internal clock for reading out the data.
Figure 2:
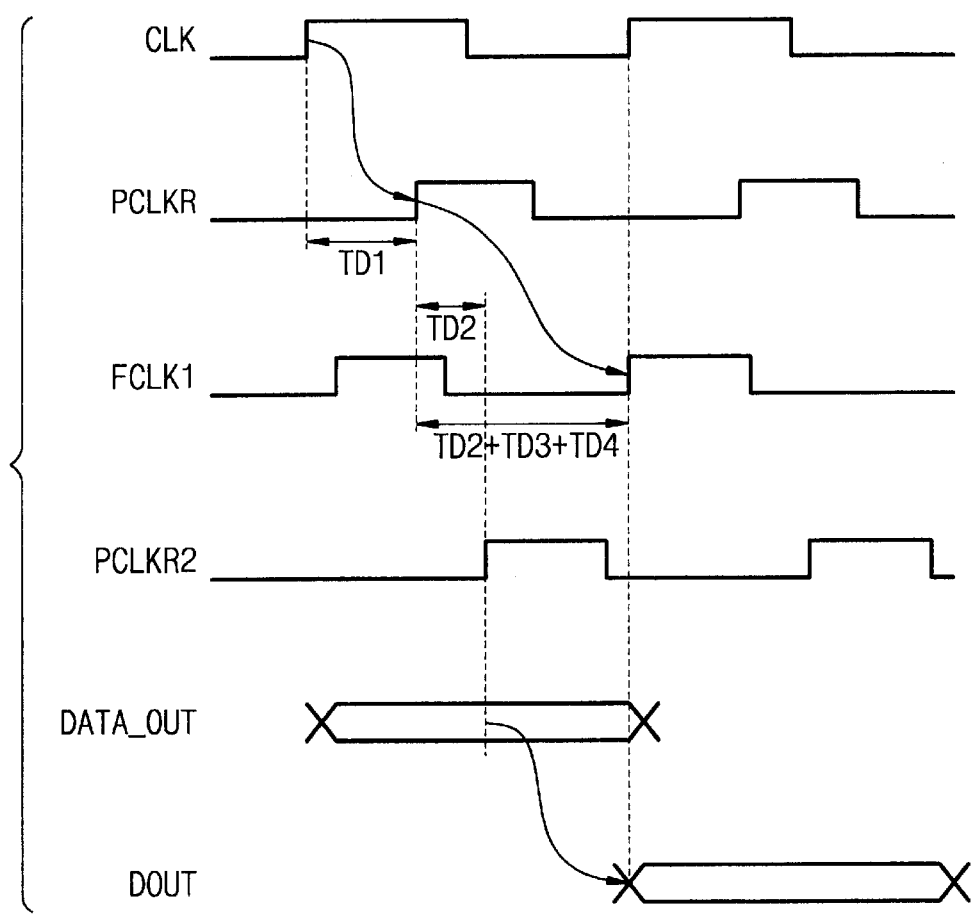
FIG. 2 is a timing diagram for describing a reading out operation of the circuit of FIG. 1.
Figure 3:
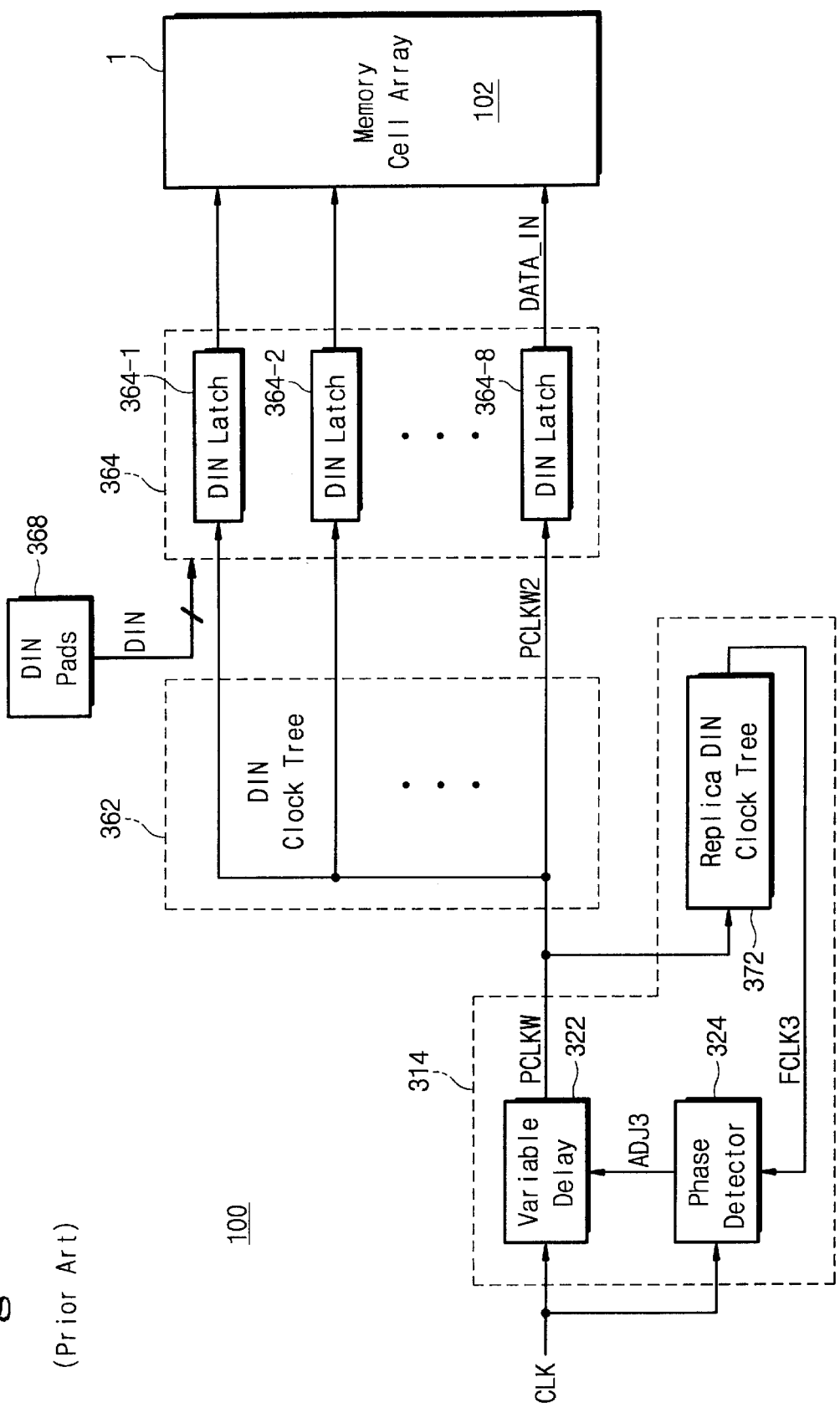
FIG. 3 is a block diagram of another portion of the prior art device of FIG. 1, showing a circuit for writing data into the memory cell array, and of a delay lock loop for controlling a delay of an internal clock for writing in the data.
Figure 4:
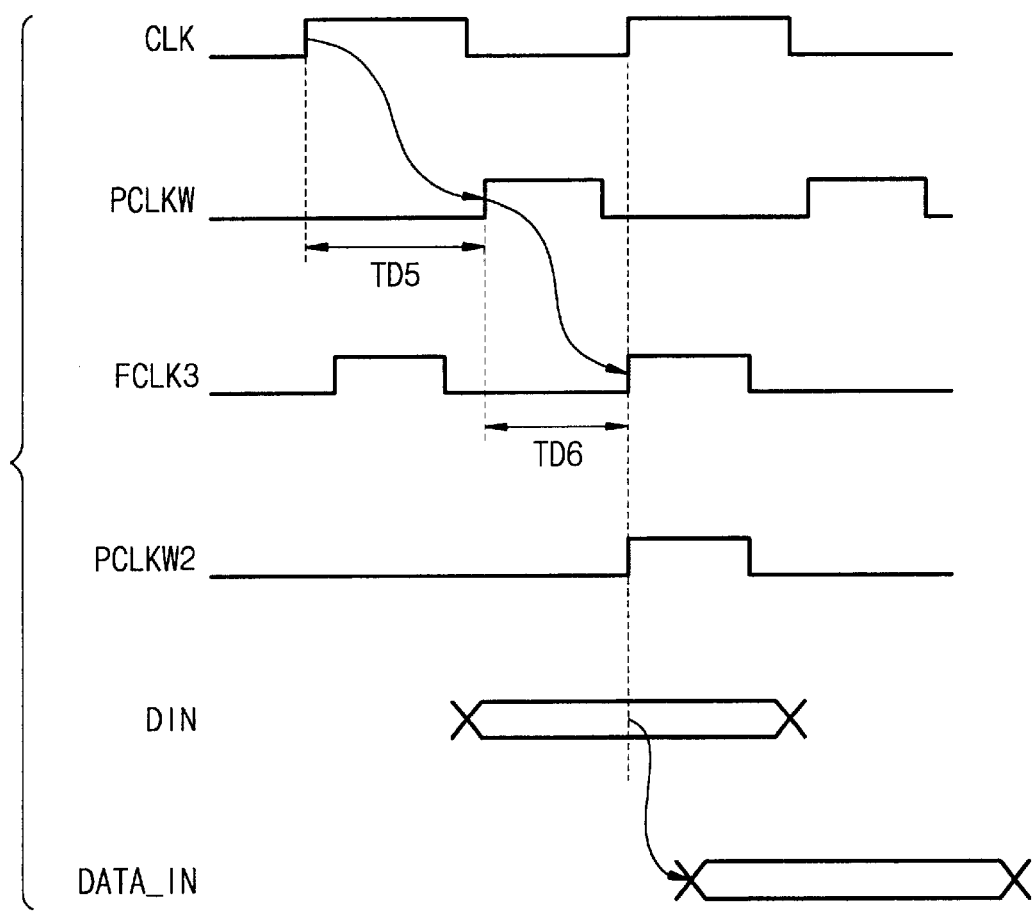
FIG. 4 is a timing diagram for describing a writing operation of the circuit of FIG. 3.
Figure 5:
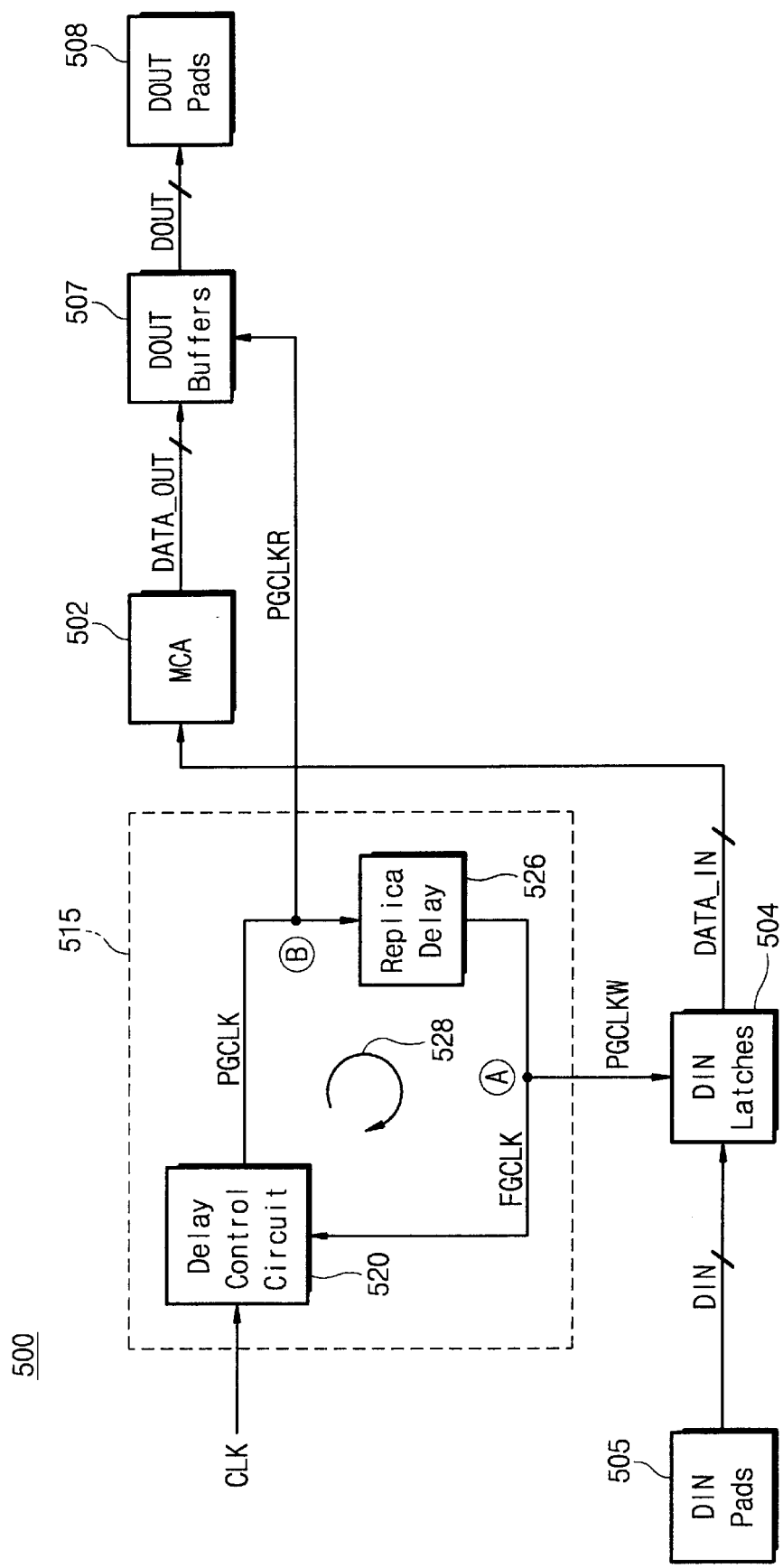
FIG. 5 is a block diagram of a circuit in a device made according to an embodiment of the present invention.

Referring now to FIG. 5, a memory device 500 made according to a general embodiment of the invention is shown.

Device 500 includes a Memory Cell Array (MCA) 502 for storing data. It also receives an input clock signal CLK, for timing its operations.

Device 500 also includes a group of Data In (DIN) Latches 504, and a group of DIN Pads 505. Data received at DIN Pads 505 is latched by DIN Latches 504 for inputting in MCA 502 as DATA_IN.

Device 500 moreover includes a group of Data Out (DOUT) Buffers 507, and a group of DOUT Pads 508. Data from MCA 502 as DATA_OUT is received and stored in DOUT Buffers 507, for forwarding to DOUT Pads 508 as DOUT.

All embodiments of the invention include devices where a group of data may be made from any number of data, e.g. X4, X8, X16, X32, X64, etc. Each group will have the appropriate number of elements.

Device 500 further includes other circuitry, not shown in the brief block diagram of FIG. 5. Such is not included in FIG. 5 (and also in other Figs.), so as to better elucidate the description of the invention. Other circuitry for implementing the device of FIG. 5 will be understood from the remainder of this document, and also from the present general knowledge in the art.

Importantly, device 500 includes a lock loop circuit 515, which receives the input clock signal CLK. Lock loop circuit 515 outputs a write control signal PGCLKW to DIN Latches 504. Write control signal PGCLKW is thus used to synchronize inputting the data in MCA 502.

Lock loop circuit 515 also outputs a read control signal PGCLKR to DOUT Buffers 507. Read control signal PGCLKR is thus used to synchronize buffering the data received from MCA 502.

In the preferred embodiment, lock loop circuit 515 includes a delay control circuit 520 and at least one Replica Delay 526, coupled as shown.

Delay control circuit 520 receives input clock signal CLK, and produces an internal clock signal PGCLK. Delay control circuit 520 also receives a feedback clock signal FGCLK.

Internal clock signal PGCLK is delayed from input clock signal CLK by an amount controlled by feedback clock signal FGCLK. In particular, circuit 520 adjusts its own delay so that a phase of feedback clock signal FGCLK is maintained the same as that of input clock signal CLK.

Replica Delay 526 may be made from a single delay unit (as shown in FIG. 5), or from a number of them. Replica Delay 526 receives internal clock signal PGCLK, and delays it to generate feedback clock signal FGCLK.

Importantly, Replica Delay 526 delays internal clock signal PGCLK along a single loop 528, which is shown as an arrow within lock loop circuit 515. In other words, Replica Delay 526 defines a loop with Delay Control Circuit 520. The loop has a beginning at the output of Delay Control Circuit 520 (where internal clock PGCLK is produced), and an end at the input of Delay Control Circuit 520 where feedback control signal FGCLK is received.

A significant feature of the invention is that both write control signal PGCLKW and read control signal PGCLKR are produced by tapping at tapping points A, B of the single loop 528. More specifically, write control signal PGCLKW is received from a first tapping point A of loop 528 as the internal clock signal PGCLK. Plus, read control signal PGCLKR is received from a second tapping point B of loop 528, as again the internal clock signal PGCLK. Read control signal PGCLKR is enabled during read operations, and write control signal PGCLKW is enabled during write operations. Some of these operations may be concurrent.

If tapping points A, B are different, then write control signal PGCLKW has a first delay from internal clock signal PGCLK, and read control signal PGCLKR has a second delay from internal clock signal PGCLK.

The first and second delays are generally different. One of them may well be zero. For example, tapping point A is shown in FIG. 5 as wholly after Replica Delay 526 in loop 528, and thus write control signal PGCLKW coincides with signal FGCLK. Further, tapping point B is shown as wholly before Replica Delay 526 in loop 528, and thus read control signal PGCLKR coincides with signal PGCLK. While that combination is possible, it is not necessary for practicing the invention. Other tapping points are possible, also between individual delay elements of Replica Delay 526, as will be seen below.

The advantage of the invention is that a single loop 528 is used for generating the signals, and that is for both the read control signal and the write control signal. This saves space compared to the prior art.

Figure 6:
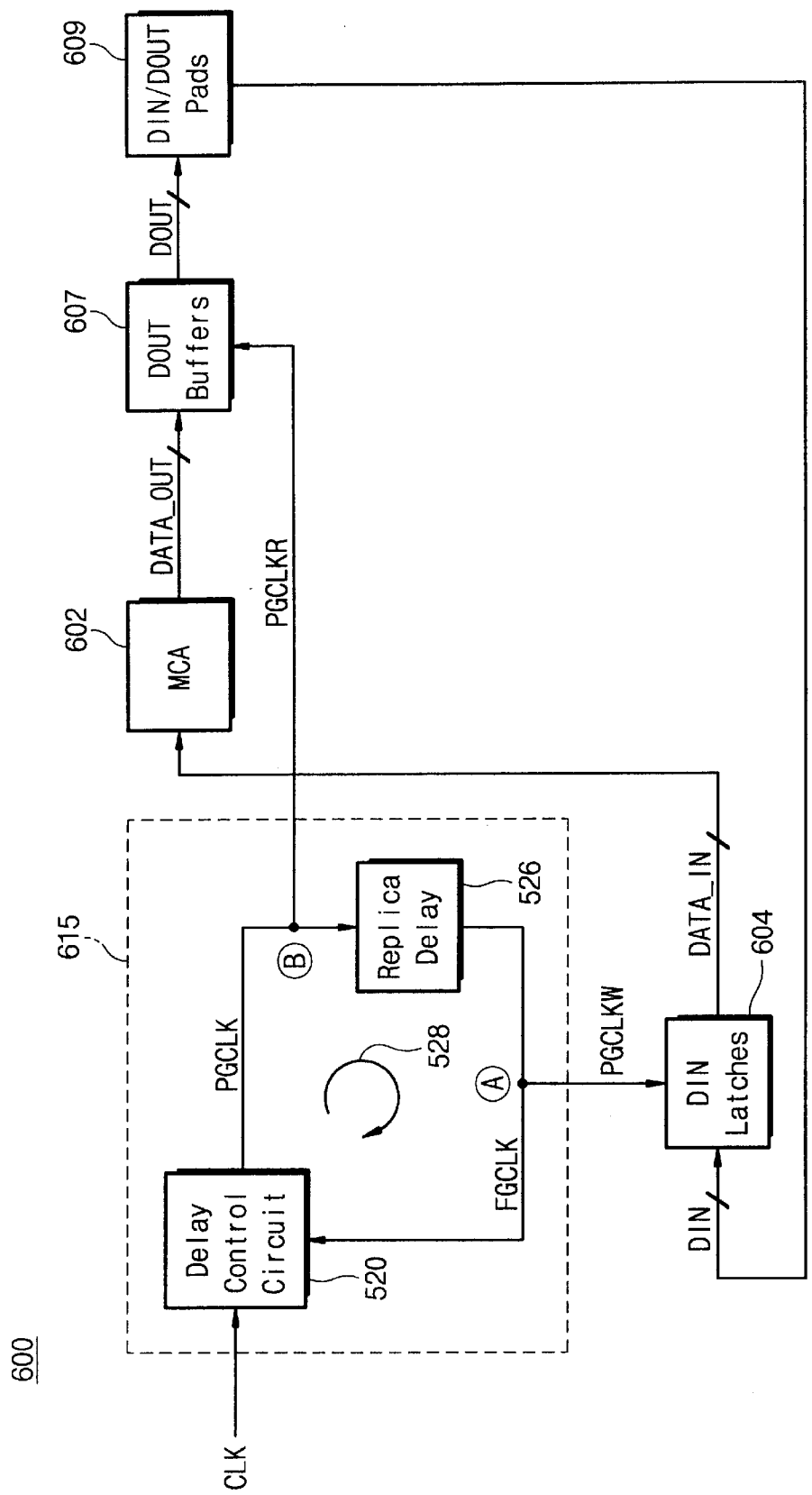
FIG. 6 is a block diagram of a circuit in another device made according to an embodiment of the present invention.

Referring now to FIG. 6, a memory device 600 made according to another general embodiment of the invention is shown.

Device 600 includes a Memory Cell Array (MCA) 602 for storing data. It also receives an input clock signal CLK, for timing its operations.

Device 600 also includes a group of Data In (DIN) Latches 604, and a group of Data Out (DOUT) Buffers 607. These are used for inputting data into and outputting data from MCA 602.

Device 600 moreover includes a group of DIN/DOUT Pads 609. DIN/DOUT Pads 609 are used both for inputting data (to DIN Latches 604), and also for outputting data (from DOUT Buffers 607). In other words, memory device 600 uses a common set of pads 609 for both its input and output operations. While the device operates in the read operation, DIN/DOUT Pads 609 operate as DOUT Pads. While the device operates in the write operation, DIN/DOUT Pads 609 operate as DIN Pads. Usually DRAMs share DIN/DOUT Pad.

Importantly, device 600 includes a lock loop circuit 615, which may be made identically to circuit 515 of FIG. 5. In other words, the invention may be practiced with memory devices where the data input/output pads are not common (FIG. 5) or are shared (FIG. 6).

More particularly, lock loop circuit 615 includes Delay Control circuit 520 and Replica Delay 526, which form a loop 528. Delay Control circuit 520 receives the input clock signal CLK. Lock loop circuit 515 outputs a write control signal PGCLKW to DIN Latches 604, and a read control signal PGCLKR to DOUT Buffers 607. These signals synchronize the writing and reading operations of the groups of data.

Delay Control circuit 520 may be made in a variety of ways according to the invention. Two such ways are described with reference to FIG. 7 and FIG. 8, as circuits 520-A and 520-B.

Figure 7:
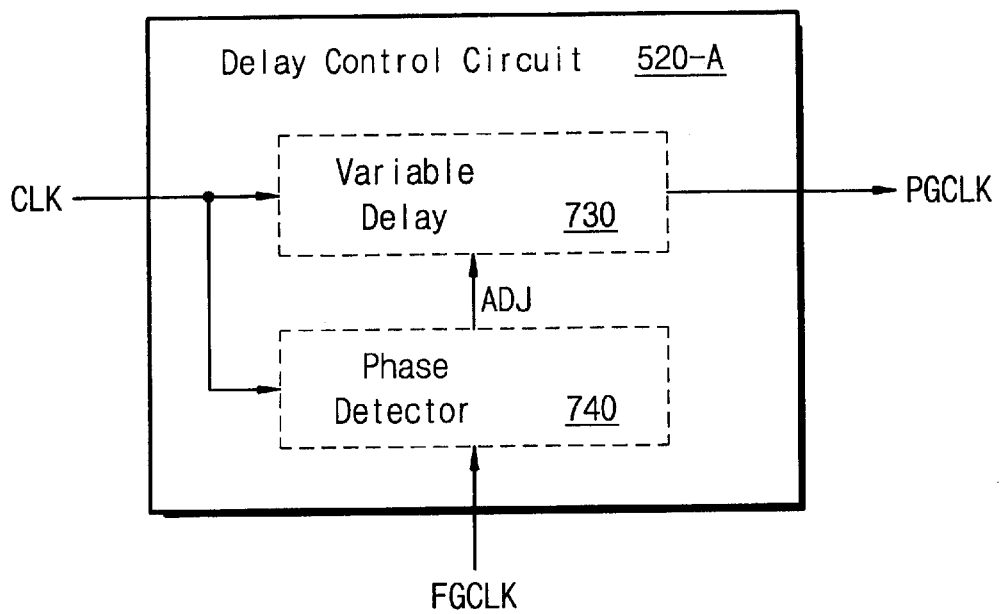
FIG. 7 is a block diagram of a delay control circuit in the circuit of the device of FIG. 5 or FIG. 6 according to a Delay Lock Loop embodiment of the invention.

Referring now to FIG. 7, Delay Control circuit 520-A includes a Variable. Delay circuit 730 and a Phase Detector circuit 740. The input clock signal CLK is received by both a Variable Delay circuit 730 and a Phase Detector circuit 740.

Variable Delay circuit 730 receives an adjustment signal ADJ. Thus it generates the internal clock signal PGCLK, by delaying the input clock signal CLK responsive to adjustment signal ADJ. Variable Delay circuit 730 may be made in a number of ways known in the art. One such way is with n delay terminals, where one of them is chosen by adjustment signal ADJ. A variable delay range is defined by the predetermined number of delay terminals.

Phase Detector circuit 740 receives the feedback clock signal FGCLK. Then it generates adjustment signal ADJ by comparing the input clock signal CLK with the feedback clock signal FGCLK. Adjustment signal ADJ is such that the inputs of Phase Detector 740 are maintained in phase. In other words, adjustment signal ADJ is such that the phase of the feedback clock signal FGCLK is maintained to coincide with the phase of input clock signal CLK.

The embodiment of FIG. 7 corresponds to a Delay Lock Loop (DLL) implementation. Even though the internal clock signal supplied by the DLL circuit is shifted with respect to input clock signal CLK, the phase of the internal clock signal is earlier than that of input clock signal CLK.

Figure 8:
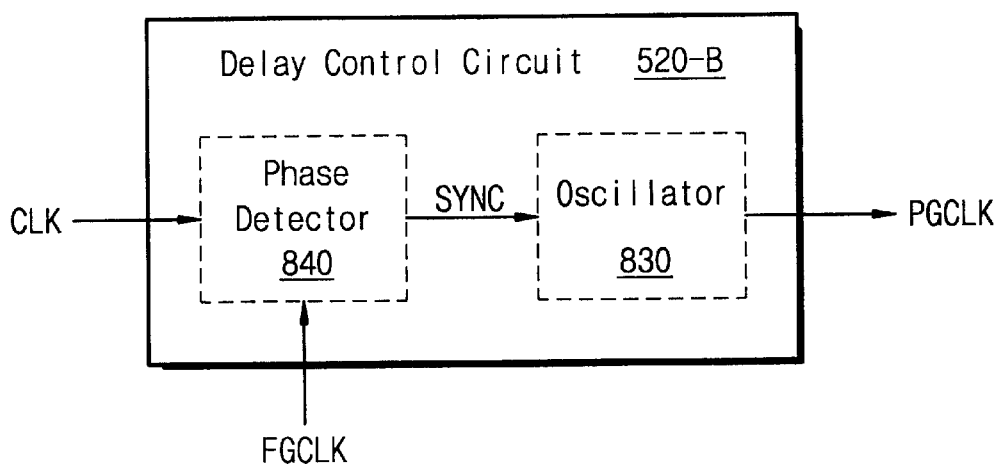
FIG. 8 is a block diagram of a delay control circuit in the circuit of the device of FIG. 5 or FIG. 6 according to a Phase Lock Loop embodiment of the invention.

Referring now to FIG. 8, Delay Control circuit 520-B includes an Oscillator 830 and a Phase Detector circuit 840.

Oscillator 830 receives a synchronization signal SYNC. Thus it generates the internal clock signal PGCLK, by delaying the input clock signal CLK responsive to synchronization signal SYNC. Oscillator 830 may be made in a number of ways known in the art, such as from an oscillator, a pulse generator, and so on.

Phase Detector circuit 840 receives input clock signal CLK and the feedback clock signal FGCLK. Then it generates synchronization signal SYNC by comparing the input clock signal CLK with the feedback clock signal FGCLK.

In one embodiment, synchronization signal SYNC is such that the inputs of Phase Detector 840 are maintained in phase. In other words, synchronization signal. SYNC is such that the phase of the feedback clock signal FGCLK is maintained to coincide with the phase of input clock signal CLK.

Figure 9:
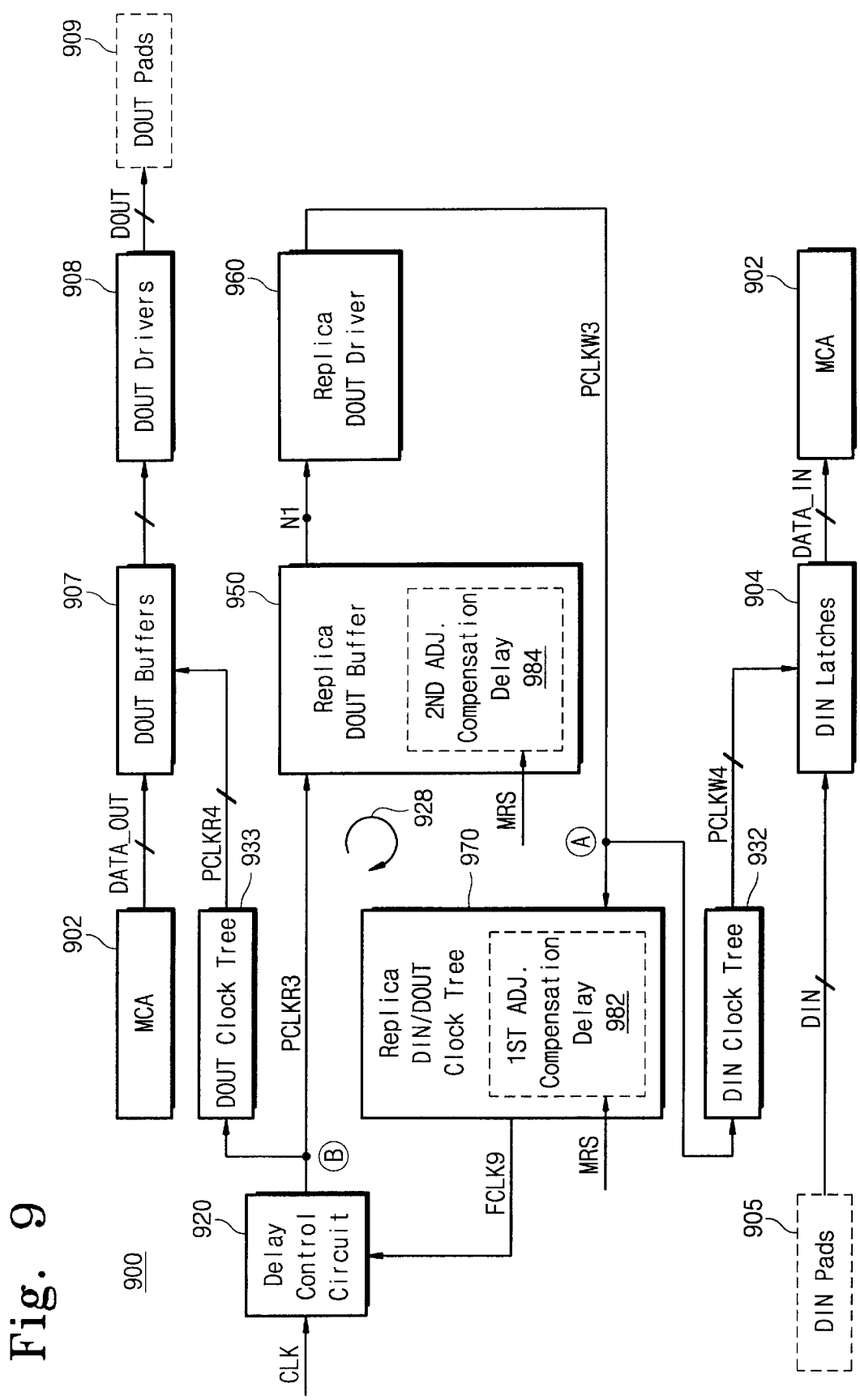
FIG. 9 is a more detailed block diagram of a circuit in a device made according to an embodiment of the invention.

Referring now to FIG. 9, a memory device 900 has a circuit made according to an embodiment of the invention. The device includes a Memory Cell Array (MCA) 902 for storing and retrieving data.

The circuit of device 900 also includes an input branch for inputting data in MCA 902, which is made from a group of DIN Pads 905 and a group of DIN Latches 904.

The circuit of device 900 moreover includes an output branch for outputting data from MCA 902, which is made from a group of DOUT buffers 907, a group of DOUT Drivers 908 and a group of DOUT Pads 909.

The circuit of device 900 may be implemented where the data input/output pads are shared, as shown elsewhere in this document.

The circuit of device 900 additionally includes a delay control circuit 920 and a replica delay circuit. In the embodiment of FIG. 9, replica delay circuit is made by one or more devices arranged to form a feedback loop 928.

Delay control circuit 920 receives input clock signal CLK, and produces an internal clock signal PCLKR3. The internal clock signal PCLKR3 is then delayed along loop 928, and input back into circuit 920 as feedback clock signal FCLK3.

Delay control circuit 920 can be made in any way that Delay Control circuit 520 is made, e.g. as in circuit 520-A of FIG. 7, or as in circuit 520-A of FIG. 8. Delay control circuit 920 receives feedback clock signal FCLK3, and adjusts accordingly an amount of how much internal clock signal PCLKR3 is delayed from input clock signal CLK.

At least two tapping points A and B are defined in loop 928. Tapping point A is used by the data input branch, and tapping point B is used by the data output branch.

In the embodiment of FIG. 9, at tapping point A, the intermediate clock signal PCLKW3 on loop 928 is fed into a DIN clock tree 932. From there, it emerges as a write control signal PCLKW4, and is delivered to DIN Latches 904, to synchronize the writing. Accordingly, write control signal PCLKW4 has a first delay from the internal clock signal PCLKR3.

Further in the embodiment of FIG. 9, tapping point B coincides with the output of delay control circuit 920. This is not necessary for practicing the present invention, and other embodiments are also possible.

At tapping point B, internal clock signal PCLKR3 on loop 928 is fed into a DOUT clock tree 932. From there, it emerges as a read control signal PCLKR4, and is delivered to DOUT Buffers 907, to synchronize the reading. Accordingly, read control signal PCLKR4 has a second delay from the internal clock signal PCLKR3.

In FIG. 9, a replica delay circuit is made by three delay devices 950, 960, 970 arranged to form feedback loop 928. These are described in more detail below.

Delay device 950 is a replica data output buffer (seen as replica DOUT buffer 950). It has a delay determined from the DOUT Buffers 907.

Delay device 960 is a replica data output driver (seen as replica DOUT Driver 960). It is located after the replica data output buffer 950 in loop 928. Replica data output driver 960 has a delay determined from DOUT Drivers 908.

Delay device 970 is a replica clock tree (seen as replica DIN/DOUT clock tree 970). It is located after the replica data output driver 960 in loop 928. Replica clock tree 970 has a delay determined from DIN clock tree 932.

The design of FIG. 9 is advantageous in that first tapping point A is an output of the replica data output driver 960. This provides a signal PCLKW3 with enough strength for being input in DIN Clock tree 932.

Another way to think of the design of FIG. 9 is that delay device 950 and delay device 960 form a first replica delay circuit, which receives internal clock signal PCLKR3 and outputs an intermediate clock signal PCLKW3. Moreover, delay device 970 forms a second replica delay circuit, which receives intermediate clock signal PCLKW3 and outputs feedback clock signal FCLK9.

Figure 10:
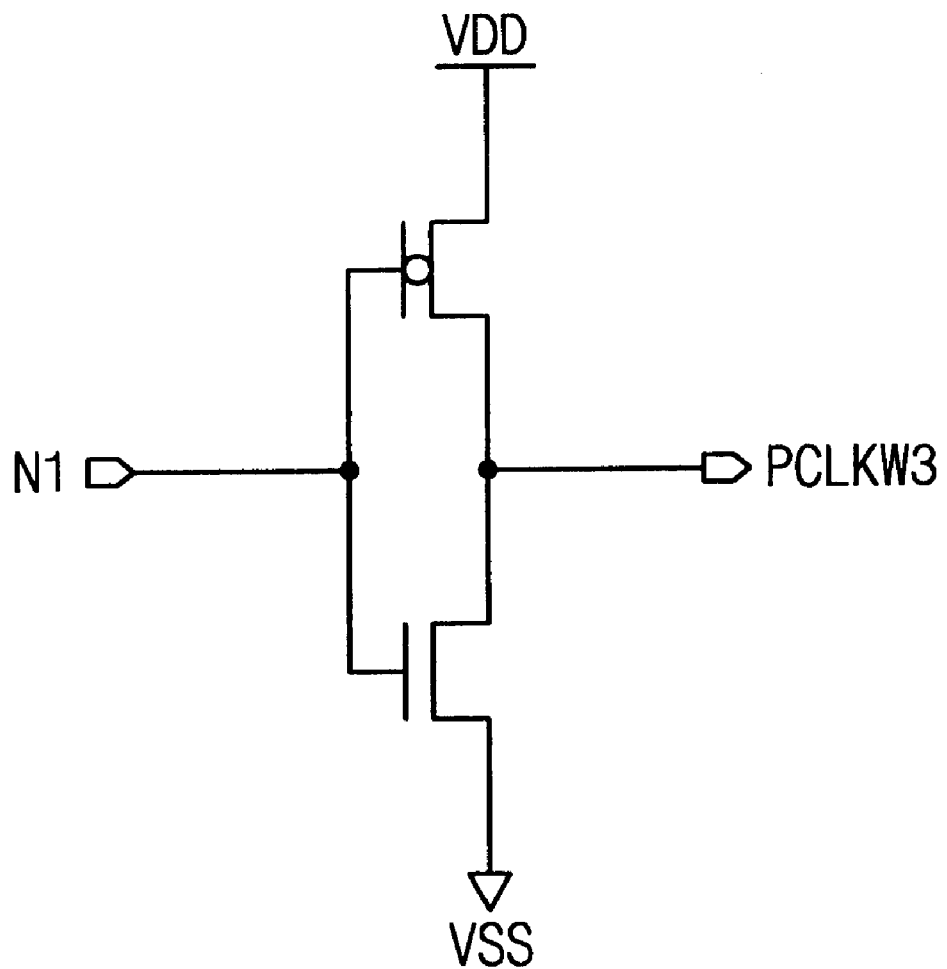
FIG. 10 is a circuit diagram for a component of the circuit of FIG. 9.

Referring now to FIG. 10, a design is shown for replica data output driver 960. A buffer generates signal PCLKW3 from a signal at a node N1. A delay can be adjusted by varying the size of PMOS/NMOS transistors in FIG. 10.

Figure 11:
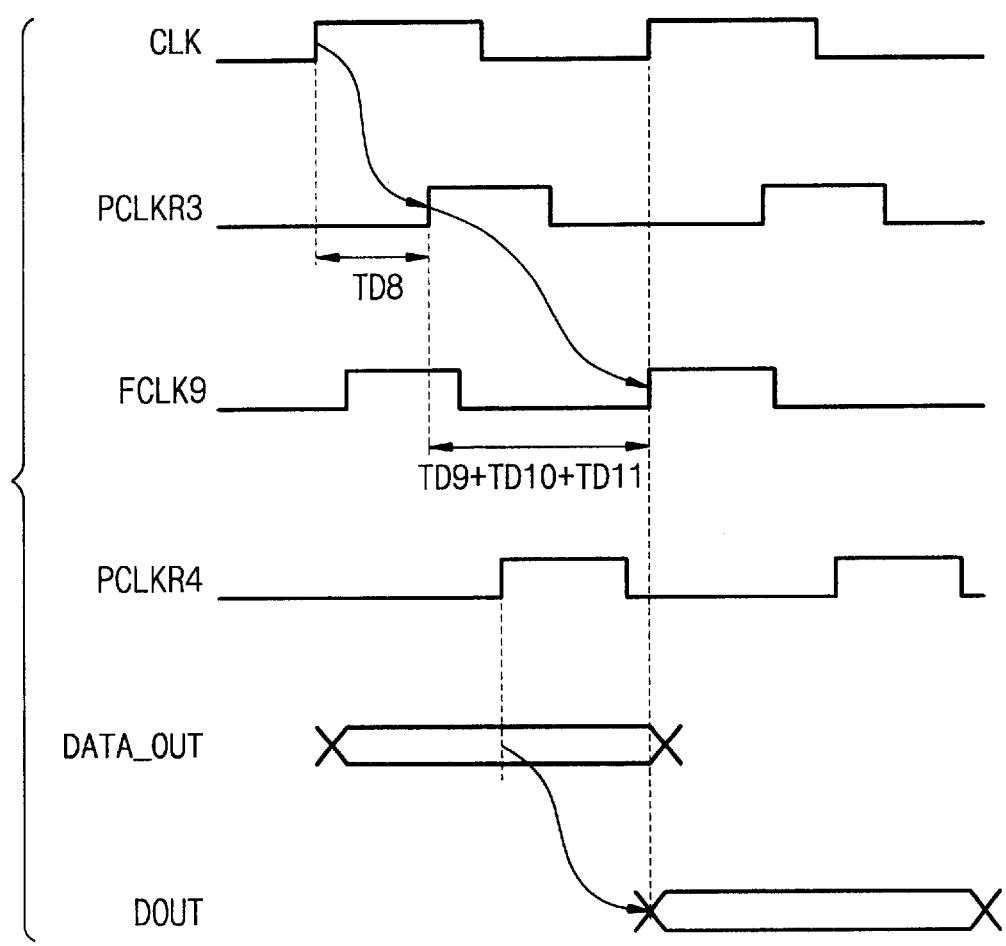
FIG. 11 is a timing diagram illustrating a reading operation of the circuit of FIG. 9.
Figure 12:
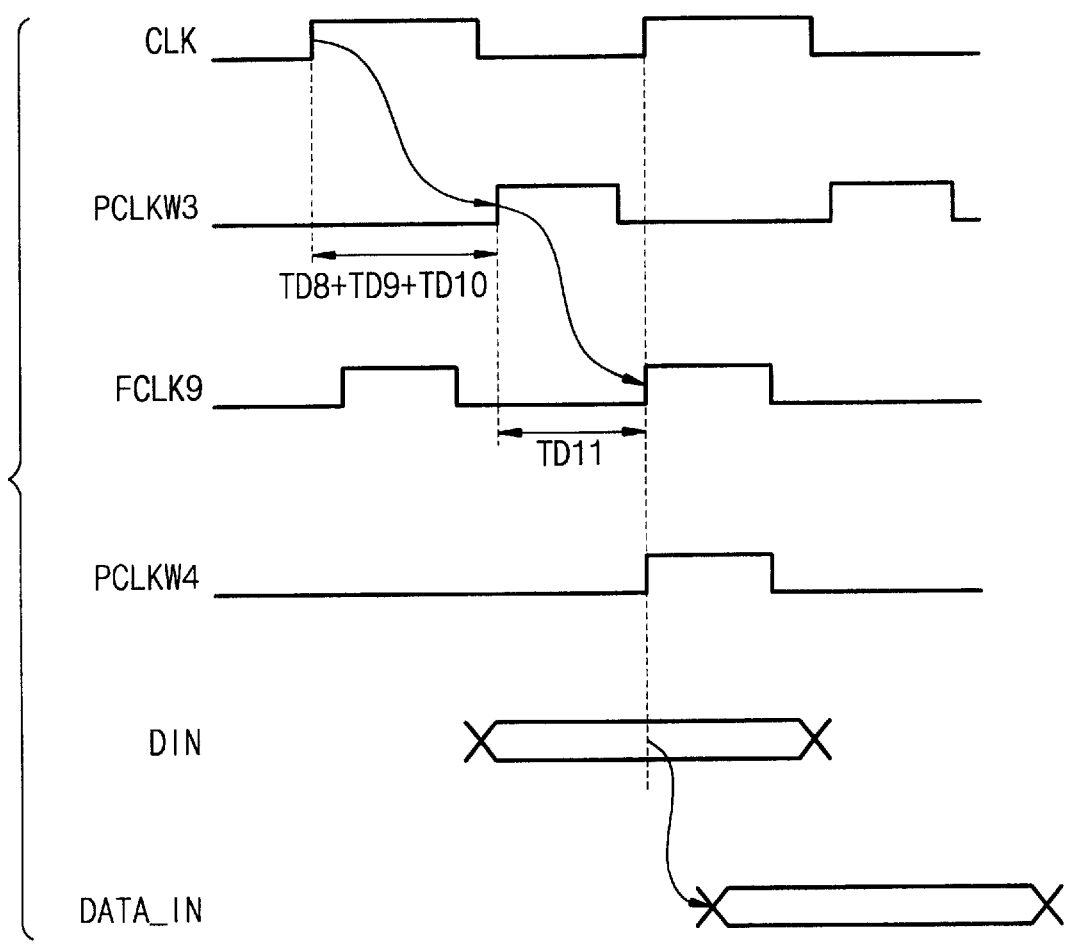
FIG. 12 is a timing diagram illustrating a writing operation of the circuit of FIG. 9.

Referring to FIG. 11 and FIG. 12, the operations of the circuit of FIG. 9 are illustrated. TD8 is a delay of the delay control circuit 920. TD9 is a delay of replica DOUT buffer 950. TD10 is a delay of replica DOUT driver 960. TD11 is a delay of replica DIN/DOUT clock tree 970.

Returning to FIG. 9, it is highly advantageous to make DIN clock tree 932 have the same delay as DOUT clock tree 933. That is facilitated in the embodiments where the DIN pads and the DOUT pads are shared.

If, however, DIN clock tree 932 does not have the same delay as DOUT clock tree 933, other arrangements are preferably made. These include making a first adjustment to the delay of second replica delay circuit (delay devices 970), and then optionally compensating for the first adjustment by making a second adjustment to the delay of the first replica delay circuit (delay devices 950, 960).

More particularly, the replica clock tree 970 includes a first adjustable compensation delay feature 982. Feature 982 is for making a first differential adjustment to an internal delay of replica clock tree 970. The first differential adjustment is so that the delay of the replica clock tree 970 matches that of DIN clock tree 932. It is preferred that the first differential adjustment is determined from a difference in delay between DOUT clock tree 933 and DIN clock tree 932.

In one embodiment, feature 982 is controlled by an external programmable control signal MRS. That may be a Mode Register Set signal, which thus controls the amount of time delay. Another embodiment is described later.

In addition, either replica data output buffer 950 or replica data output driver 960 includes a second adjustable compensation delay feature 984. Feature 984 is for making a second differential adjustment to an internal delay of its host device. Again, second adjustable compensation delay feature 984 may be controlled by an external programmable control signal.

The second differential adjustment is made to compensate for the first differential adjustment in a total delay of loop 928. The second differential adjustment may be made according to a delay of the data output clock tree 933, and optionally further according to a delay of the data input clock tree 932.

For a first example, if the delay time of the DOUT clock tree 933 is 1.0 ns, the delay time of the replica DOUT Buffer 950 is 1.0 ns, and the delay time of DIN clock tree 932 is 0.8 ns, first the compensation delay 982 is adjusted to be 0.8 ns delayed, and then compensation delay 984 has to be added to be 1.2 ns delayed. In other words, the delay time of the replica DIN/DOUT Clock Tree 970 is finally set to be 0.8 ns, and the delay time of replica DOUT Buffer 950 is finally set to be 1.2 ns.

As another example, if the delay time of the replica DOUT clock tree 933 is 1.0 ns, the delay time of replica DOUT Buffer 950 is 1.0 ns, and the delay time of the replica DIN Clock Tree 932 is 1.2 ns, first the compensation delay 982 is adjusted to be 1.2 ns delayed, and then compensation delay 984 has to be reduced to be 0.8 ns delayed. In other words, the delay time of the replica DIN/DOUT Clock Tree 970 is finally set to be 1.2 ns, and the delay time of replica DOUT Buffer 950 is finally set to be 0.8 ns.

Figure 13:
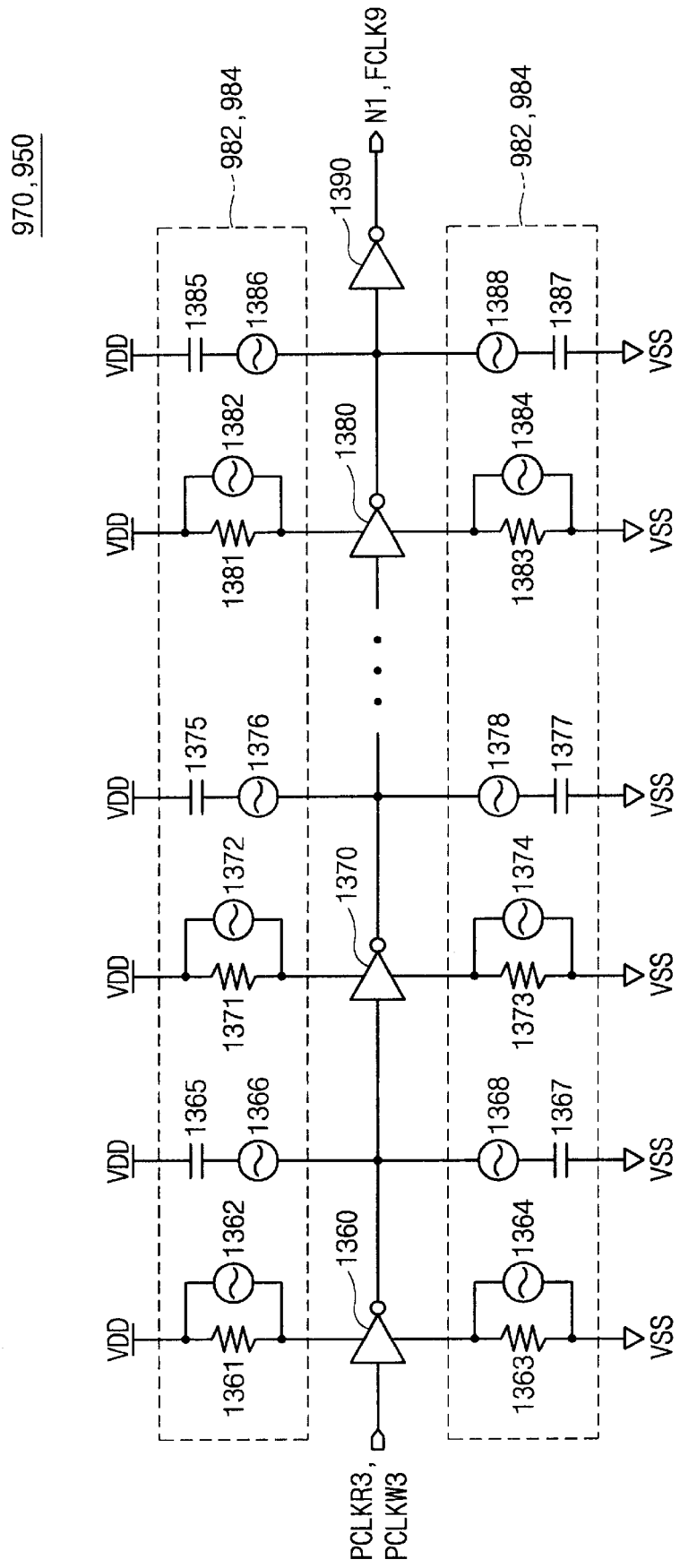
FIG. 13 is a circuit diagram for a component of the circuit of FIG. 9.

Referring now to FIG. 13, another embodiment is shown for first adjustable compensation delay feature 982 and second adjustable compensation delay feature 984. It will be appreciated that the embodiment of FIG. 13 does not include receiving programmable control signals.

FIG. 13 shows an embodiment of replica DIN/DOUT clock tree 970, or replica DOUT buffer 950. It includes a series of inverters 1360, 1370, . . . , which receive signal PCLKR3 and yield the signal at node N1 (delay device 950), or receive signal PCLKW3 and yield signal FCLK9 (delay device 970). Around these inverters there are a number of resistors 1361, 1363, . . . , a number of capacitors 1365, 1368, and a number of fuses 1362, 1364. The amount of delay can be adjusted by cutting fuses 1362, 1364, whether by adding or by subtracting delay.

Figure 14:
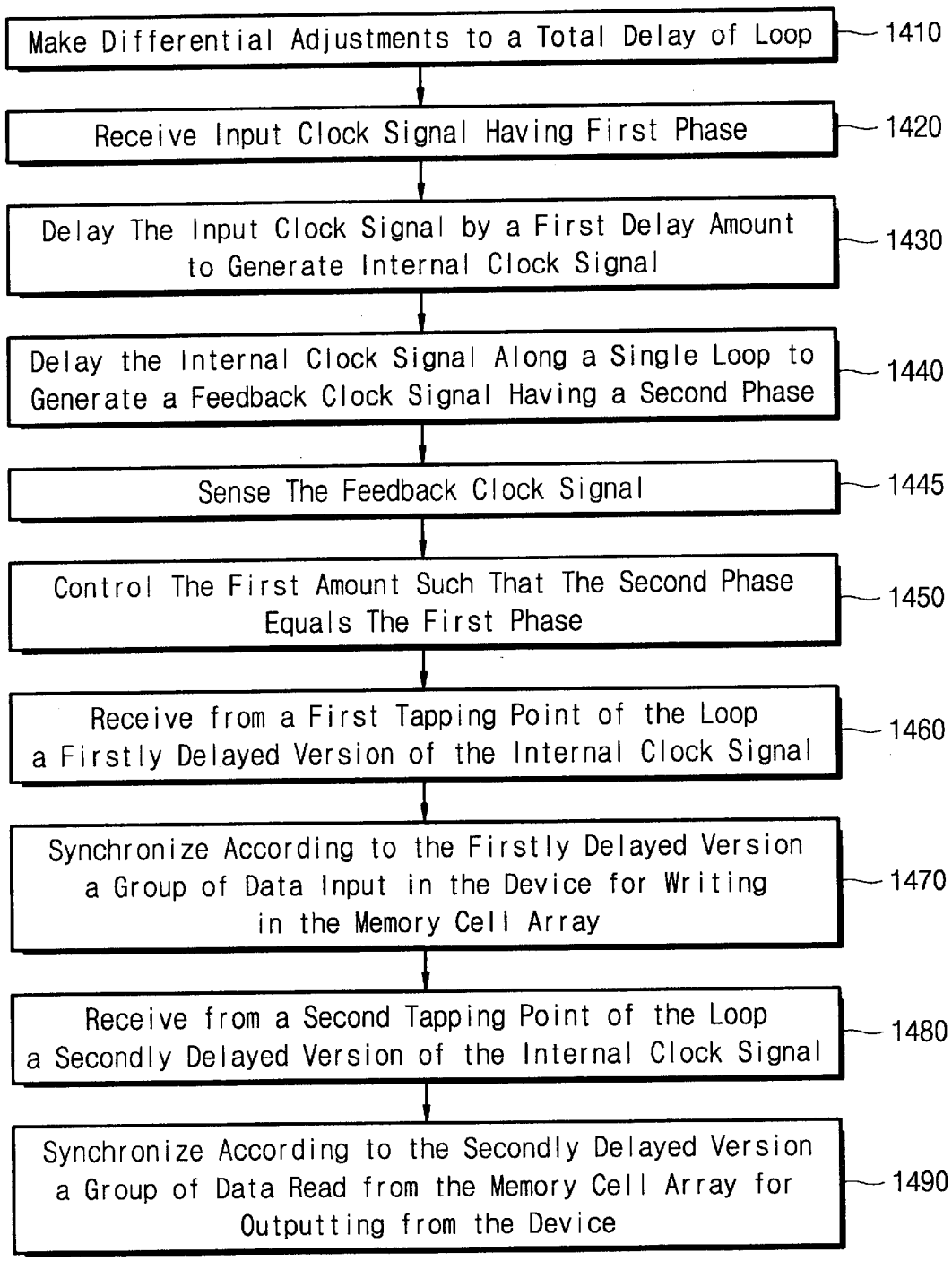
FIG. 14 is a flowchart illustrating a method according to an embodiment of the present invention.

Referring now to FIG. 14, a flowchart 1400 is used to illustrate a method according to an embodiment of the invention. The method of flowchart 1400 may also be practiced in a semiconductor memory device or a semiconductor memory device, or in other non-memory semiconductor devices.

According to an optional box 1410, one or more differential adjustments are made to a total delay of a loop. A second differential adjustment may be for compensating for a first differential adjustment in a total delay of the loop. These differential adjustments are made either by setting one or more external programmable control signals, or cutting a fuse.

According to a next box 1420, an input clock signal is received, that has a first phase.

According to a next box 1430, the input clock signal is delayed by a first delay amount. This generates an internal clock signal.

According to a next box 1440, the internal clock signal is delayed along a single loop. This generates a feedback clock signal having a second phase.

According to a next box 1445, the feedback clock signal is sensed.

According to a next box 1450, the first amount is controlled such that the second phase equals the first phase. Controlling can be performed from the sensed feedback clock signal, either by using a delay lock loop, or by using a phase lock loop.

According to a next box 1460, a firstly delayed version of the internal clock signal is received from a first tapping point of the loop.

According to a next box 1470, a group of data input in a device is synchronized according to the received firstly delayed version, for writing in a semiconductor device (or a memory cell array of the semiconductor memory device).

According to a next box 1480, a secondly delayed version of the internal clock signal is received from a second tapping point of the same loop as in box 1460.

According to an optional next box 1490, a group of data read from the semiconductor device (or the memory cell array) is synchronized according to the received secondly delayed version for outputting from the device.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A circuit in a semiconductor memory device that has a memory cell array, comprising:
   a delay control circuit to generate an internal clock signal responsive to an input clock signal and to a feedback clock signal;
   at least one replica delay circuit defining a loop with the delay control circuit, the replica delay circuit to receive the internal clock signal at a beginning of the loop and to generate at an end of the loop the feedback clock signal from the received internal clock signal;
   a group of data input latches to input data into the memory cell array, and to synchronize inputting the data according to the internal clock signal received with a first delay from a first tapping point of the loop; and a group of data output buffers to buffer data received from the memory cell array, and to synchronize buffering the received data according to the internal clock signal received with a second delay from a second tapping point of the loop.

2. The circuit of claim 1, in which the feedback clock signal is the internal clock signal received with a first delay from the first tapping point of the loop.

3. The circuit of claim 1, in which the delay control circuit includes:

a variable delay circuit to generate the internal clock signal by delaying the input clock signal responsive to an adjustment signal, and a phase detector to generate the adjustment signal by comparing the input clock signal with the feedback clock signal.

4. The circuit of claim 1, in which the delay control circuit includes:

an oscillator to generate the internal clock signal responsive to a synchronization signal, and a phase detector to generate the synchronization signal by comparing the input clock signal with the feedback clock signal.

5. The circuit of claim 1, further comprising:

a data output clock tree coupled between the second tapping point and the data output buffer;

a data output driver; and a data input clock tree coupled between the first tapping point and the data input latch, and in which the replica delay circuit includes:
 a replica data output buffer having a delay determined from the data output buffer,
 a replica data output driver located after the replica data output buffer in the loop, the replica data output driver having a delay determined from the data output driver, and
 a replica clock tree located after the replica data output driver in the loop, the replica clock tree having a delay determined from the data input clock tree,
 and in which the second tapping point is an input of the replica data output buffer.

6. The circuit of claim 5, further comprising:

a data input/output pad coupled directly to both the data output driver and to the data input latch.

7. The circuit of claim 5, in which the first tapping point is an output of the replica data output driver.

8. The circuit of claim 5, in which the replica clock tree includes a first adjustable compensation delay feature to make a first differential adjustment so that the delay of the replica clock tree matches that of the data input clock tree.

9. The circuit of claim 8, in which the first differential adjustment is determined from a difference in delay between the data output clock tree and the data input clock tree.

10. The circuit of claim 8, in which the first adjustable compensation delay feature is controlled by an external programmable control signal.

11. The circuit of claim 8, in which the first adjustable compensation delay feature includes a fuse.

12. The circuit of claim 8, in which one of the replica data output buffer and the replica data output driver has an internal delay and includes a second adjustable compensation delay feature to make a second differential adjustment to the internal delay.

13. The circuit of claim 12, in which the second adjustable compensation delay feature is controlled by an external programmable control signal.

14. The circuit of claim 12, in which the second adjustable compensation delay feature includes a fuse.

15. The circuit of claim 12, in which the second differential adjustment is made to compensate for the first differential adjustment in a total delay of the loop.

16. A circuit in a semiconductor memory device that has a memory cell array, comprising:

a delay control circuit to generate an internal clock signal responsive to an input clock signal and to a feedback clock signal;

at least one replica delay circuit defining a loop with the delay control circuit, the replica delay circuit to receive the internal clock signal at a beginning of the loop and to generate at an end of the loop the feedback clock signal from the received internal clock signal;

a group of data input latches to input data into the memory cell array, and to synchronize inputting the data according to the internal clock signal received with a first delay from a first tapping point of the loop; and a group of data output buffers to buffer data received from the memory cell array, and to synchronize buffering the received data according to the internal clock signal received with a second delay from a second tapping point of the loop, and in which the replica delay circuit includes
 a fuse, and
 a compensation delay feature that has a delay which is adjustable by cutting the fuse.

17. The circuit of claim 16, in which the delay control circuit includes:

a variable delay circuit to generate the internal clock signal by delaying the input clock signal responsive to an adjustment signal, and a phase detector to generate the adjustment signal by comparing the input clock signal with the feedback clock signal.

18. The circuit of claim 16, in which the delay control circuit includes:

an oscillator to generate the internal clock signal responsive to a synchronization signal, and a phase detector to generate the synchronization signal by comparing the input clock signal with the feedback clock signal.

19. The circuit of claim 16, further comprising:

a data output clock tree coupled between the second tapping point and the data output buffer;

a data output driver; and a data input clock tree coupled between the first tapping point and the data input latch, and in which the replica delay circuit includes:
 a replica data output buffer having a delay determined from the data output buffer,
 a replica data output driver located after the replica data output buffer in the loop, the replica data output driver having a delay determined from the data output driver, and a replica clock tree located after the replica data output driver in the loop, the replica clock tree having a delay determined from the data input clock tree, and in which the second tapping point is an input of the replica data output buffer.

20. A circuit in a semiconductor memory device that has a memory cell array, comprising:

a delay control circuit to generate an internal clock signal responsive to an input clock signal and to a feedback clock signal;

a replica delay circuit to input the internal clock signal and to output the feedback clock signal;

a group of data input latches to input data into the memory cell array, and to synchronize inputting the data according to the feedback clock signal; and a group of data output buffers to buffer data received from the memory cell array, and to synchronize buffering the received data according to the internal clock signal.

21. The circuit of claim 20, in which the delay control circuit includes:

a variable delay circuit to generate the internal clock signal by delaying the input clock signal responsive to an adjustment signal, and a phase detector to generate the adjustment signal by comparing the input clock signal with the feedback clock signal.

22. The circuit of claim 20, in which the delay control circuit includes:

an oscillator to generate the internal clock signal responsive to a synchronization signal, and a phase detector to generate the synchronization signal by comparing the input clock signal with the feedback clock signal.

23. A circuit in a semiconductor memory device that has a memory cell array, comprising:

a delay control circuit to generate an internal clock signal responsive to an input clock signal and to a feedback clock signal;

a first replica delay circuit to input the internal clock signal and to output an intermediate clock signal;

a second replica delay circuit to input the intermediate clock signal and to output the feedback clock signal;

a group of data input latches to input data into the memory cell array, and to synchronize inputting the data according to the intermediate clock signal; and a group of data output buffers to buffer data received from the memory cell array, and to synchronize buffering the received data according to the internal clock signal.

24. The circuit of claim 23, in which the delay control circuit includes:

a variable delay circuit to generate the internal clock signal by delaying the input clock signal responsive to an adjustment signal, and a phase detector to generate the adjustment signal by comparing the input clock signal with the feedback clock signal.

25. The circuit of claim 23, in which the delay control circuit includes:

an oscillator to generate the internal clock signal responsive to a synchronization signal, and a phase detector to generate the synchronization signal by comparing the input clock signal with the feedback clock signal.

26. The circuit of claim 23, in which the first replica delay circuit has an internal delay, and includes a first adjustable compensation delay feature to make a first differential adjustment to its internal delay.

27. The circuit of claim 26, in which the first adjustable compensation delay feature is controlled by an external programmable control signal.

28. The circuit of claim 26, in which the first adjustable compensation delay feature includes a fuse.

29. The circuit of claim 26, in which the second replica delay circuit has an internal delay, and includes a second adjustable compensation delay feature to make a second differential adjustment to its internal delay.

30. The circuit of claim 29, in which the second adjustable compensation delay feature is controlled by an external programmable control signal.

31. The circuit of claim 29, in which the second adjustable compensation delay feature includes a fuse.

32. A circuit in a semiconductor device, comprising:

a delay control circuit to generate an internal clock signal responsive to an input clock signal and to a feedback clock signal;

a first replica delay circuit to input the internal clock signal and to output an intermediate clock signal;

a second replica delay circuit to input the intermediate clock signal and to output the feedback clock signal;

a group of data input latches to input data into a semiconductor device, and to synchronize inputting the data according to the intermediate clock signal; and a group of data output buffers to output data from the semiconductor device, and to synchronize outputting the data according to the internal clock signal.

33. The circuit of claim 32, in which the replica delay circuit includes a fuse, and a compensation delay feature that has a delay which is adjustable by cutting the fuse.

34. The circuit of claim 32, in which the delay control circuit includes:

a variable delay circuit to generate the internal clock signal by delaying the input clock signal responsive to an adjustment signal, and a phase detector to generate the adjustment signal by comparing the input clock signal with the feedback clock signal.

35. The circuit of claim 32, in which the delay control circuit includes:

an oscillator to generate the internal clock signal responsive to a synchronization signal, and a phase detector to generate the synchronization signal by comparing the input clock signal with the feedback clock signal.

36. A semiconductor memory device comprising:

means for generating an internal clock signal responsive to an input clock signal and to a feedback clock signal;

means for receiving the internal clock signal at a beginning of a loop and for generating at an end of the loop the feedback clock signal from the received internal clock signal;

means for inputting data into a memory cell array;

means for synchronizing inputting the data according to the internal clock signal received with a first delay from a first tapping point of the loop;

means for outputting data received from the memory cell array; and means for synchronizing outputting the received data according to the internal clock signal received with a second delay from a second tapping point of the loop.

37. A semiconductor device comprising:

means for generating an internal clock signal responsive to an input clock signal and to a feedback clock signal;

means for receiving the internal clock signal at a beginning of a loop and for generating at an end of the loop the feedback clock signal from the received internal clock signal;

means for inputting data into a semiconductor device;

means for synchronizing inputting the data according to the internal clock signal received with a first delay from a first tapping point of the loop;

means for outputting data from the semiconductor device; and means for synchronizing outputting the data according to the internal clock signal received with a second delay from a second tapping point of the loop.

38. The device of claim 37, in which the means for generating the internal clock signal includes:

means for generating the internal clock signal by delaying the input clock signal responsive to an adjustment signal, and means for generating the adjustment signal by comparing the input clock signal with the feedback clock signal.

39. The device of claim 37, in which the means for generating the internal clock signal includes:

means for generating the internal clock signal responsive to a synchronization signal, and means for generating the synchronization signal by comparing the input clock signal with the feedback clock signal.

40. The device of claim 37, further comprising:

means for making a first differential adjustment to a total delay of the loop.

41. The device of claim 40, in which the means for making the first differential adjustment includes a fuse.

42. The device of claim 40, further comprising:

means for making a second differential adjustment to a total delay of the loop.

43. The device of claim 42, in which the means for making the second differential adjustment includes a fuse.

44. A method for a semiconductor memory device having a memory cell array comprising:

receiving an input clock signal having a first phase;

delaying the received input clock signal by a first amount to generate an internal clock signal;

delaying the internal clock signal along a single loop to generate a feedback clock signal having a second phase;

controlling the first amount such that the second phase equals the first phase;

receiving from a first tapping point of the loop a firstly delayed version of the internal clock signal;

synchronizing, according to the firstly delayed version, a group of data input in the device for inputting in the memory cell array;

receiving from a second tapping point of the loop a secondly delayed version of the internal clock signal; and synchronizing, according to the secondly delayed version, a group of data output from the memory cell array for outputting from the device.

45. A method for a semiconductor device comprising:

receiving an input clock signal having a first phase;

delaying the received input clock signal by a first amount to generate an internal clock signal;

delaying the internal clock signal along a single loop to generate a feedback clock signal having a second phase;

controlling the first amount such that the second phase equals the first phase;

receiving from a first tapping point of the loop a firstly delayed version of the internal clock signal;

synchronizing, according to the firstly delayed version, a group of data input in the device for inputting in a semiconductor device;

receiving from a second tapping point of the loop a secondly delayed version of the internal clock signal; and synchronizing, according to the secondly delayed version, a group of data output from the memory cell array for outputting from the semiconductor device.

46. The method of claim 45, further comprising:

sensing the feedback clock signal to control the first amount.

47. The method of claim 45, further comprising:

making a first differential adjustment to a total delay of the loop.

48. The method of claim 47, in which the first differential adjustment is made by cutting a fuse.

49. The method of claim 47, in which the first adjustable compensation delay feature is made by setting an external programmable control signal.

50. The method of claim 47, further comprising:

making a second differential adjustment to a total delay of the loop.

51. The method of claim 50, in which the second differential adjustment is made by cutting a fuse.

52. The method of claim 50, in which the second adjustable compensation delay feature is made by setting an external programmable control signal.

53. The method of claim 50, in which the second differential adjustment is made to compensate for the first differential adjustment in a total delay of the loop.

* * * * *